(12) United States Patent
Miyagi (10) Patent No.: US 6,858,520 B2
(45) Date of Patent: *Feb. 22, 2005

(54) METHOD OF MANUFACTURING SEMICONDUCTOR DEVICE

(75) Inventor: Masanori Miyagi, Chiba (JP)

(73) Assignee: Seiko Instruments Inc., Chiba (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/573,145

(22) Filed: Dec. 15, 1995

(65) Prior Publication Data

US 2002/0019104 A1 Feb. 14, 2002

(30) Foreign Application Priority Data

Dec. 19, 1994 (JP) .............................................. 6-315215

(51) Int. Cl.⁷ .............................................. H01L 21/38

(52) U.S. Cl. ...................................... 438/549; 438/301

(58) Field of Search .................................. 257/344, 408, 257/355, 360; 438/376, 377, 549, 301, 307, 522, 542, 555, 197

(56) References Cited

U.S. PATENT DOCUMENTS

| | | | | |
|---|---|---|---|---|
| 4,198,250 A | * | 4/1980 | Jecmen ........................ | 148/1.5 |
| 4,855,247 A | * | 8/1989 | Ma et al. ............ | 148/DIG. 147 |
| 5,142,345 A | * | 8/1992 | Miyata ........................ | 257/360 |
| 5,457,060 A | * | 10/1995 | Chang ........................ | 438/549 |
| 5,486,716 A | * | 1/1996 | Saito et al. .................. | 257/360 |
| 5,543,342 A | * | 8/1996 | Mukai et al. ................ | 438/197 |
| 5,569,612 A | * | 10/1996 | Frisina et al. .................. | 437/31 |
| 5,679,971 A | * | 10/1997 | Tamba et al. ................ | 257/360 |

* cited by examiner

*Primary Examiner*—Jack Chen
(74) *Attorney, Agent, or Firm*—Adams & Wilks (57) ABSTRACT

A MOS semiconductor device is manufactured by providing a gate electrode on a semiconductor substrate through a silicon oxide film and disposing a resist mask pattern in contact with the silicon oxide film. The resist mask pattern has a fully opened region and a partially opened region disposed between the fully opened region and the gate electrode. The partially opened region has alternating masked portions and portions exposing the silicon oxide film which partly block and partly permit, respectively, the introduction of impurities therethrough. Impurities are selectively introduced into an impurity introduction region of the semiconductor substrate through the fully opened region and the partially opened region of the resist mask pattern to form areas having high and low impurity densities in the impurity introduction region.

23 Claims, 7 Drawing Sheets

PRIORART

METHOD OF MANUFACTURING SEMICONDUCTOR DEVICE

BACKGROUND OF THE INVENTION

The present invention relates to the configurations of the source and drain regions of a MOS transistor forming a part of a semiconductor integrated circuit device and, more particularly, to a manufacturing method for determining the impurity density at boundaries between the channel region and the source and drain regions.

In order to prevent the deterioration of the characteristics of MOS transistors having a small channel length due to hot carriers, which has arisen as MOS transistors have become finer, it has become common to employ an LDD structure having low-density diffusion layer regions in the vicinity of the edges of the gate electrode, i.e., in the vicinity of the boundaries between the channel region and the source and drain regions to relax a high electric field in the vicinity of the drain edge.

FIG. 7 is a schematic sectional view illustrating a process of forming source and drain diffusion layer regions of a conventional LDD type MOS transistor.

Figure 7A:
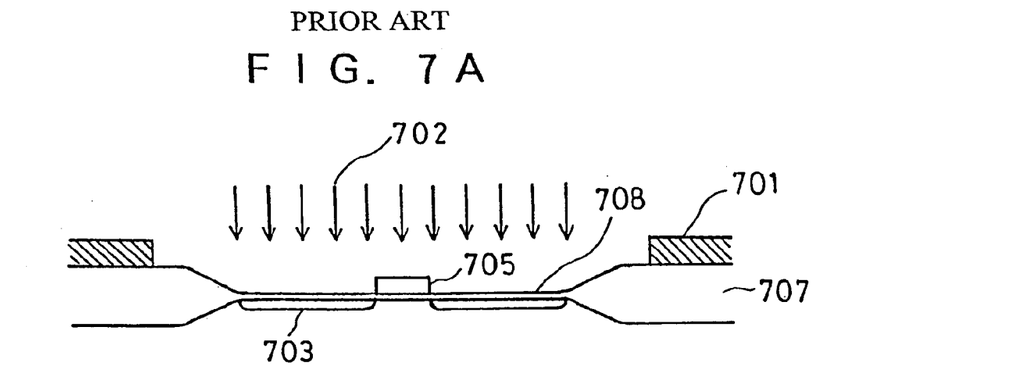
FIGS. 7A to 7D are schematic sectional views illustrating a part of a process of manufacturing the LDD type MOS transistor according to the prior art.
Figure 7B:
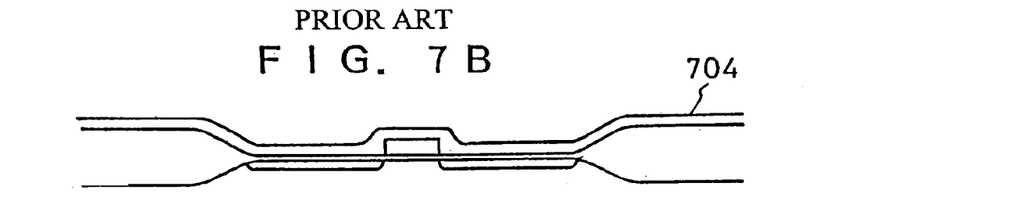

Impurities are introduced using first impurity ion beams 702 to form low-density diffusion layers of a second conductivity type in regions on a semiconductor substrate of a first conductivity type which have been selected using a patterned resist 701.

At this time, since a thick silicon oxide film 707 and a gate electrode 705 made of polysilicon or the like serve as a mask to select the regions into which impurities are to be introduced in the same manner as the resist 701, the impurities are introduced only to regions 703 under a thin silicon oxide film 708 which are not covered by the gate electrode and the resist (FIG. 7A).

Figure 7C:
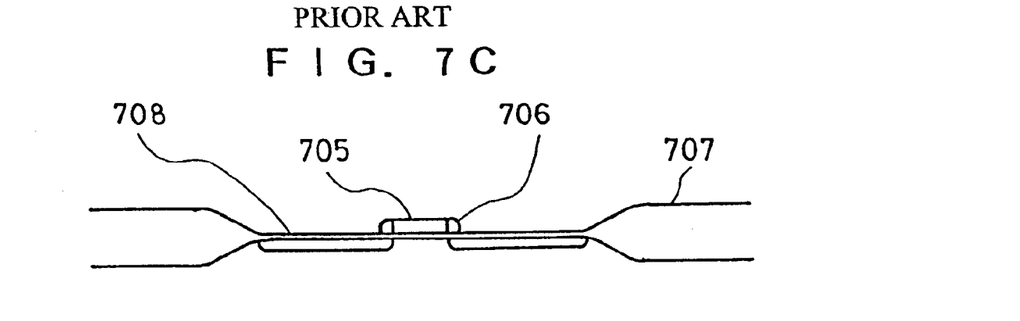

Next, after forming a silicon oxide film layer 704 on the entire surface by means of deposition using CVD or the like (FIG. 7B), anisotropic etching is performed on the silicon oxide film layer 704 to form side walls 706 constituted by silicon oxide films on the gate electrode 705 (FIG. 7C).

Figure 7D:
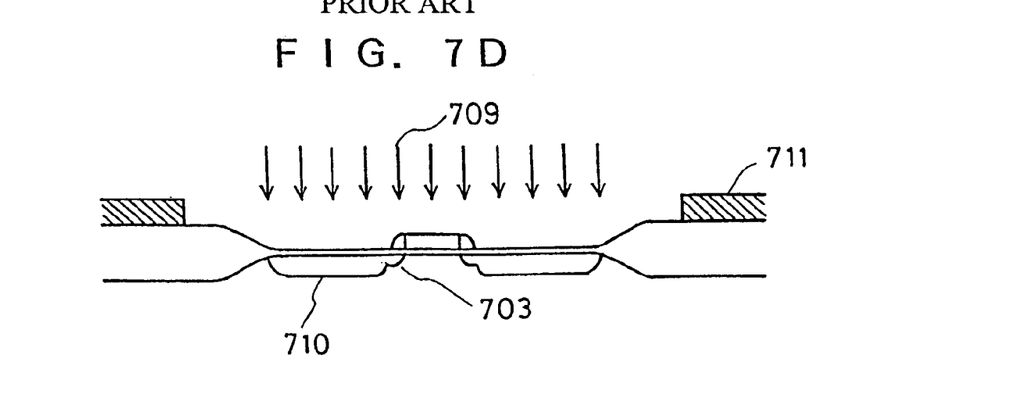

Thereafter, impurities are introduced again but, this time, using second impurity ion beams 709 to form high-density diffusion layers 710 of the second conductivity type in regions selected using a patterned resist 711 and, further, thermal diffusion is performed.

Then, the regions directly under the silicon oxide film side walls 706 become low-density diffusion layers 703 and the rest of the source and drain regions become high-density diffusion layers 710 (FIG. 7D).

Figure 6:
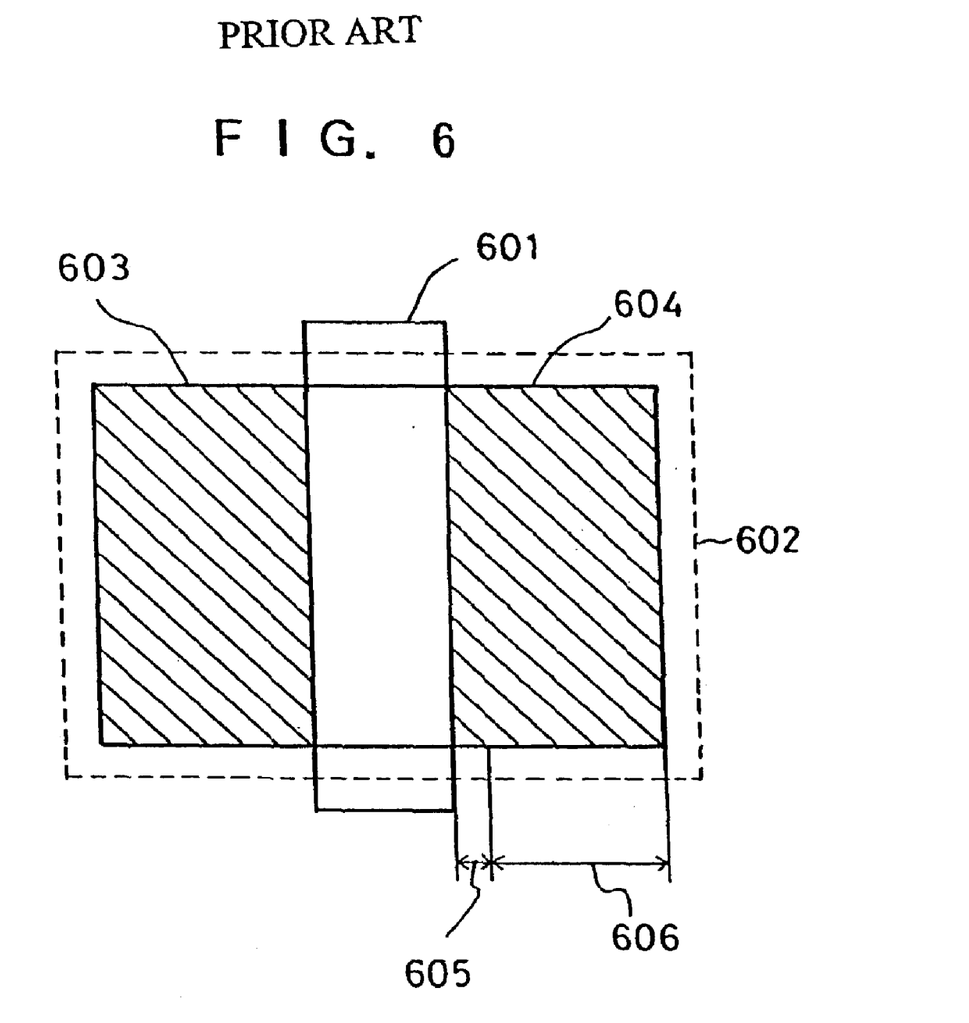
FIG. 6 is a schematic plan view of an LDD type MOS transistor according to the prior art.

When a conventional MOS transistor having an LDD structure is formed, as shown in FIG. 6, a pattern 602 as an impurity introduction mask for selecting regions into which impurities for forming low-density impurity layers and high-density impurity layers are introduced, is drawn to cover the entire surface of a source region 603, a drain region 604, and a channel region directly under a gate electrode 601 which generally serve as an active region.

It is widely known that such an LDD structure allows a MOS transistor to have higher resistance to hot carriers.

However, the cost of a conventional LDD type MOS transistor could be increased by complicated processes involved such as the two impurity introduction processes and the process of forming the silicon oxide film side walls as described above.

Further, although an LDD type MOS transistor has excellent resistance to hot carriers, it is vulnerable to surge stresses such as external static electricity, and a conventional (non-LDD) type transistor whose source and drain regions are constituted only by high-density diffusion layers is better with respect to resistance to breakage due to static electricity. As a result, semiconductor integrated circuit devices have been sometimes manufactured by adding a process for fabricating conventional (non-LDD) type MOS transistors having a relatively large channel length to be used as an input protection circuit and an output transistor instead of those having the LDD structure.

SUMMARY OF THE INVENTION

In order to solve the above-described problems, the present invention employs the following means.

As a first means, when the high-density diffusion layers in the source and drain regions of a MOS transistor are formed, a resist or the like for selecting the regions into which impurities are to be introduced is partially left in the vicinity of the side walls of the gate electrode, and thermal diffusion is performed after partially introducing impurities for forming the high-density diffusion layers to form pseudo low-density diffusion layers.

As a second means, MOS transistors formed using the first means are used only for an inner circuit which is not directly subjected to surge stresses such as external static electricity, and an input protection circuit and an output transistor are constituted by MOS transistors whose source and drain regions are formed by high-density diffusion layers obtained by not leaving the resist in the vicinity of the side walls of the gate electrode.

The first means allows low-density diffusion layers to be formed simultaneously in one process of introducing impurities for forming high-density diffusion layers.

This makes it possible to provide an LDD type MOS transistor with fewer process steps at a low cost.

The second means makes it possible to form both of an LDD type MOS transistor and a conventional (non-LDD) type MOS transistor in one process of introducing impurities for forming high-density impurity regions. It is therefore possible to provide a reliable semiconductor integrated circuit device at a lower cost.

DETAILED DESCRIPTION OF THE PREFERRED EMBODIMENTS

Embodiments of the present invention will now be described with reference to the drawings.

Figure 1:
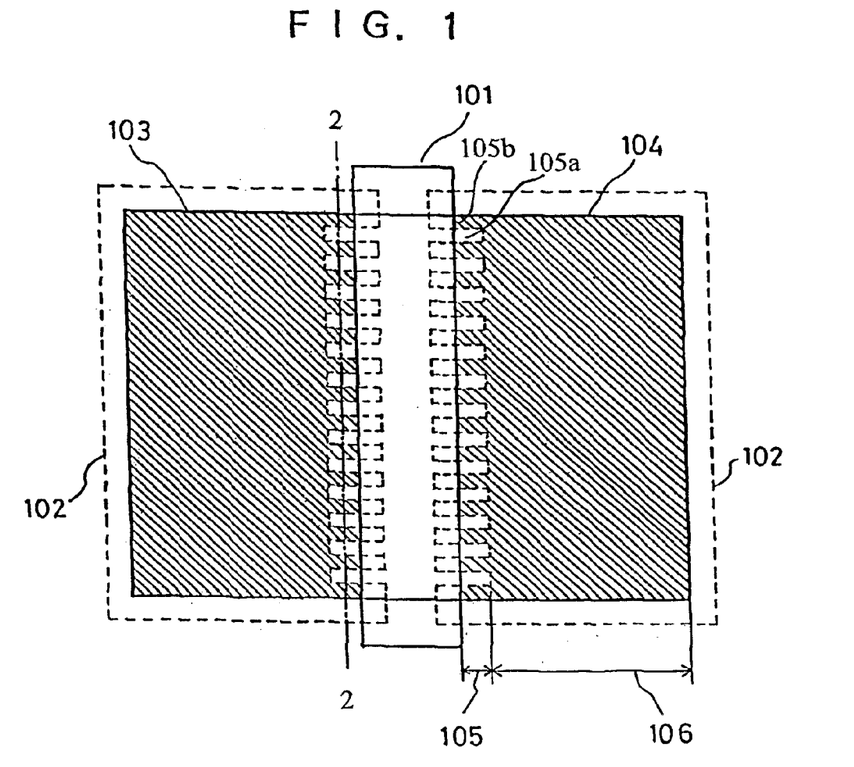
FIG. 1 is a schematic plan view of an LDD type MOS transistor according to a first embodiment of the present invention.

FIG. 1 is a schematic plan view illustrating an LDD type MOS transistor according to a first embodiment employing the first means according to the present invention.

FIGS. 2A–2D are schematic sectional views illustrating a process of forming the source and drain regions of the LDD type MOS transistor according to the first embodiment of the present invention using a patterned resist 201, gate electrode 205 and thick silicon oxide film 208 as a mask as in FIG. 7. The section 2—2 in FIG. 1 corresponds to FIG. 2B, and the direction perpendicular to 2—2 in FIG. 1 corresponds to FIG. 2A.

Figure 2A:
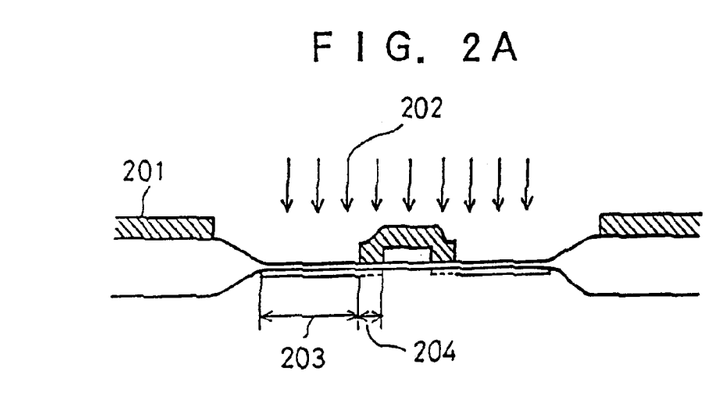
FIGS. 2A–2D are schematic sectional views illustrating a part of a process of manufacturing the LDD type MOS transistor according to the first embodiment of the present invention.
Figure 2B:
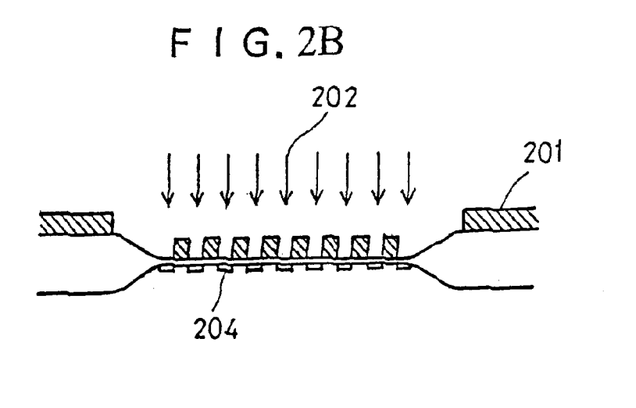

In FIG. 1, a mask pattern 102 for introducing impurities covers source and drain regions 103 and 104 and partly covers the edges of a gate electrode 101, such that impurities introduced using impurity ion beams 202 at the processes shown in FIG. 2A and FIG. 2B are introduced only in the hatched areas in FIG. 1. In this embodiment, the pattern of the mask 102 is in the form of strips having alternating masked portions 105b and the portions 105a exposing the semiconductor substrate in the vicinity of the edges of the gate electrode, 101 so that fewer impurities are introduced in the region 105 than in the region 106.

Figure 2C:
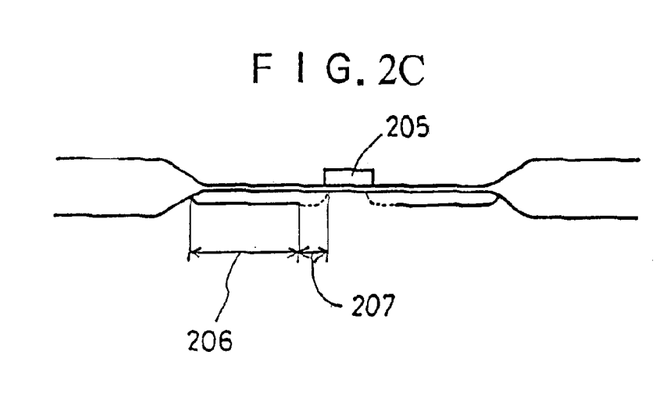
Figure 2D:
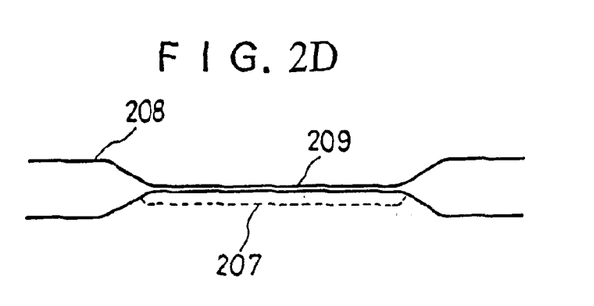

FIG. 2C and FIG. 2D are sectional views schematically illustrating the distribution of impurities after thermal diffusion is performed in the states shown in FIG. 2A and FIG. 2B. As shown in FIG. 2C and FIG. 2D, source and drain diffusion regions are formed by thermally diffusing the introduced impurities. However, if the areas where the impurities have not been introduced (i.e., the areas beneath the mask pattern projections) are sufficiently small, impurities in areas 204 where the impurities have been partially introduced (i.e., the areas beneath the mask pattern cut-outs) are thermally diffused. As a result, the areas 204 where the impurities have been partially introduced become low-density diffusion layers 207, and areas 203 where the impurities have been continuously introduced become high-density diffusion layers 206.

Figure 3:
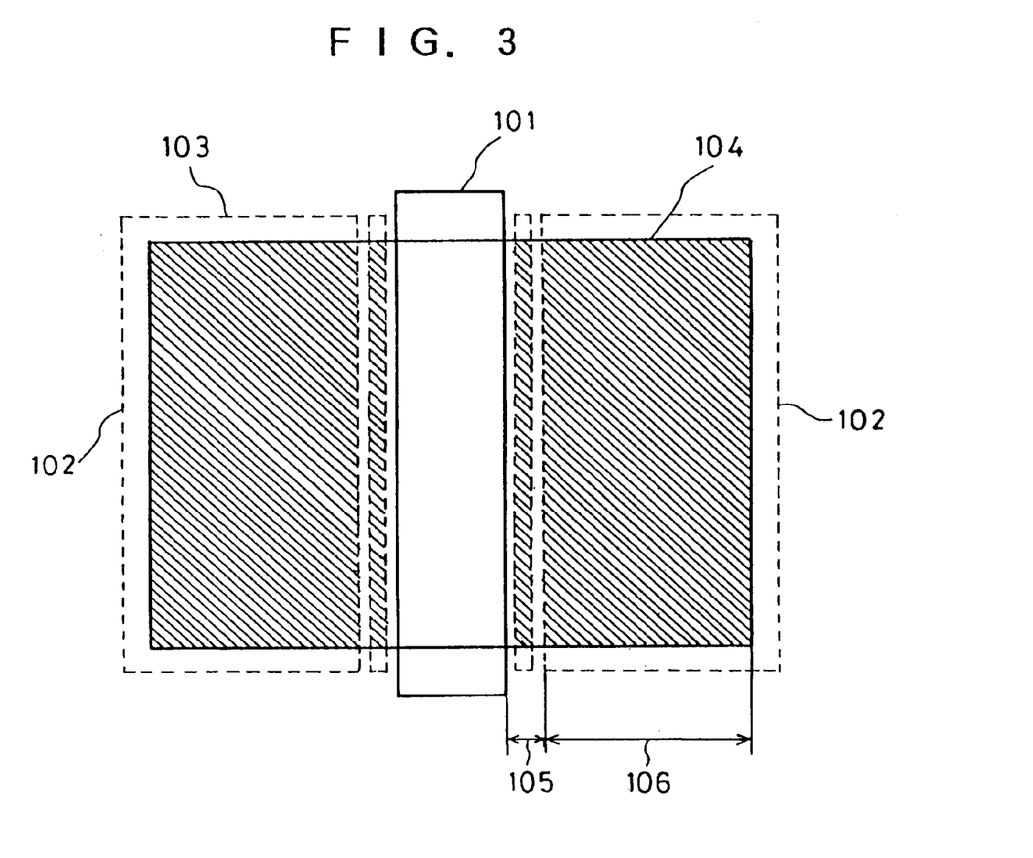
FIG. 3 is a schematic plan view of an LDD type MOS transistor according to a second embodiment of the present invention.

FIG. 3 is a plan view illustrating a second embodiment utilizing the first means according to the present invention.

In FIG. 3, the pattern of a mask 102 for introducing impurities is illustrated in the form of narrow stripes in the vicinity of the edges of a gate electrode 101.

Therefore, as in FIG. 1 and FIGS. 2A to 2D, low-density diffusion layers are formed in the vicinity 105 of the edges of the gate electrode, and the remaining regions 106 where the impurities have been continuously and widely diffused become a high-density diffusion layers.

Figure 4:
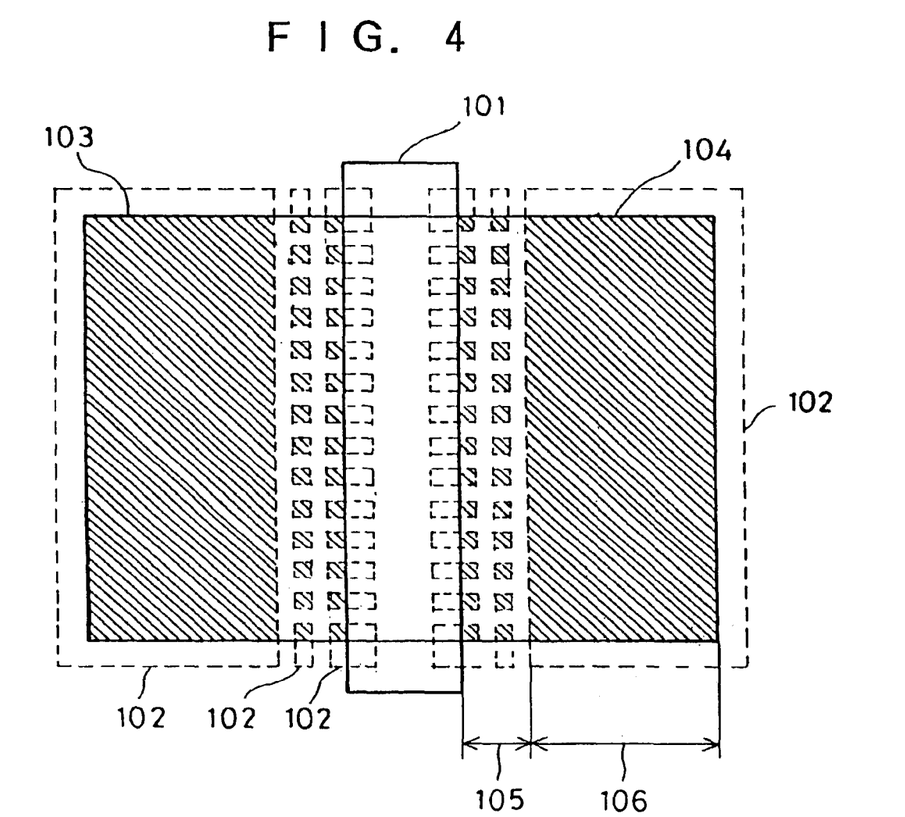
FIG. 4 is a schematic plan view of an LDD type MOS transistor according to a third embodiment of the present invention.

FIG. 4 is a plan view illustrating a third embodiment utilizing the first means according to the present invention.

In FIG. 4, the pattern of a mask 102 for introducing impurities is illustrated in the form of small dots in the vicinity of the edges of a gate electrode 101.

Therefore, again as in FIG. 1 and FIGS. 2A–2D, low-density diffusion layers are formed in the vicinity 105 of the edges of the gate electrode, and the remaining regions 106 where the impurities have been continuously and widely diffused become high-density diffusion layers.

In the above description, in order to make the distribution of the impurities in the low-density diffusion layers more uniform, the preferred pattern pitch is preferably 1 μm or less for the portion 2—2 in FIG. 1 where the pattern of the mask pattern 102 for introducing impurities meanders and for the portions in FIG. 4 where the mask pattern for introducing impurities, i.e., the pattern 102 in the form of small dots, are present and not present.

Figure 5:
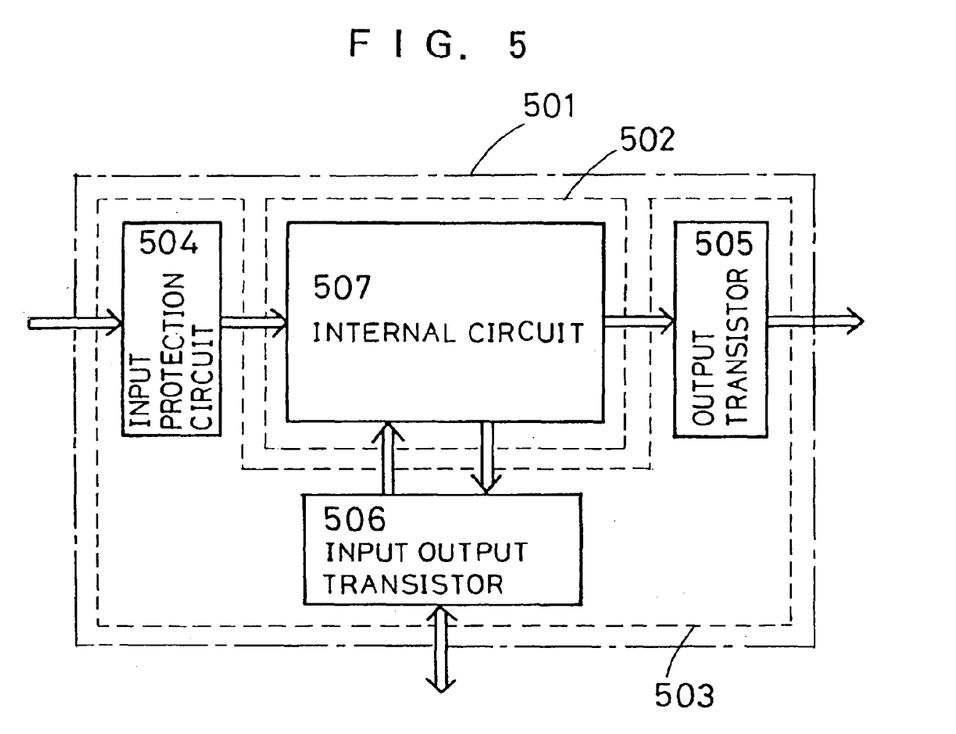
FIG. 5 is a simplified block diagram of a semiconductor integrated circuit device according to a fourth embodiment of the present invention.

FIG. 5 is a simplified block diagram of a semiconductor integrated circuit device 501 which is a fourth embodiment utilizing the second means according to the present invention.

Since LDD type MOS transistors and conventional (non-LDD) type MOS type transistors can be freely formed in the same semiconductor integrated circuit device on the same process step by leaving or not leaving a resist which is patterned by a mask pattern for introducing impurities in the vicinity of the edges of the gate electrode, as shown in FIG. 5, only an input protection circuit 504 an output transistor 505 and an input/output transistor 506 of peripheral circuitry 503 which are directly subjected to surge stresses such as external static electricity are constituted by conventional (non-LDD) type MOS transistors having a relatively large channel length, and the rest of the circuitry 502, such as the internal circuit 507, is constituted by high-speed LDD type MOS transistors having excellent resistance to hot carriers and a shorter channel length.

As described above, according to the present invention, when the high-density diffusion layers in the source and drain regions of a MOS transistor are formed, a resist or the like for selecting the regions into which impurities are to be introduced is partially left in the vicinity of the side walls of the gate electrode, and thermal diffusion is performed after partially introducing impurities for forming the high-density diffusion layers to form pseudo low-density diffusion layers. This results in an advantage in that it is possible to provide LDD type MOS transistors with less process steps at a low cost.

Further, according to the method of manufacturing a semiconductor device of the invention, it is possible to simultaneously form LDD type MOS transistors and conventional (non-LDD) type MOS transistors in the same semiconductor integrated circuit. As a result, there is an advantage in that a reliable semiconductor integrated circuit device can be provided at a lower cost by using LDD type MOS transistors for an inner circuit which is not directly subjected to surge stresses such as external static electricity and by configuring an input protection circuit and an output transistor using conventional (non-LDD) type MOS transistors whose source and drain regions are constituted only by high-density diffusion regions.

What is claimed is:

1. A method of manufacturing a MOS semiconductor device, comprising the steps: providing a semiconductor substrate having a silicon oxide film; providing a gate electrode on the semiconductor substrate through the silicon oxide film; disposing a resist mask pattern in contact with the silicon oxide film of the semiconductor substrate, the resist mask pattern having a fully opened pattern portion which permits introduction of impurities therethrough to form an area of higher impurity density and a partially opened pattern portion disposed between the area of higher impurity density and the gate electrode, the partially opened pattern portion having alternating masked portions and portions exposing the silicon oxide film which partly block and partly permit, respectively, the introduction of impurities therethrough to form an area of lower impurity density which partly overlaps with the partially opened pattern portion; and introducing impurities through the resist mask pattern into the semiconductor substrate to form therein the area of higher impurity density beneath the fully opened pattern portion and the area of lower impurity density beneath the partially opened pattern portion.

2. A method according to claim 1; wherein the partially opened pattern portion has a stripe pattern.

3. A method according to claim 1; wherein the partially opened pattern portion has a dot pattern.

4. A method according to claim 1; wherein the introducing step is carried out by implanting impurity ions into the semiconductor substrate using an ion beam.

5. A method according to claim 4; further including the step of subjecting the implanted impurity ions to thermal diffusion to convert the area of higher impurity density to a high-density impurity diffusion region and the area of lower impurity density to a low-density, impurity diffusion region.

6. A method according to claim 5; wherein the high-density and low-density impurity diffusion regions constitute one of a source diffusion region or a drain diffusion region of a MOS transistor.

7. A method according to claim 1; further including the step of subjecting the introduced impurities to thermal diffusion to convert the area of higher impurity density to a high-density impurity diffusion region and the area of lover impurity density to a low-density impurity diffusion region.

8. A method according to claim 7; wherein the high-density and low-density impurity diffusion regions constitute one of a source diffusion region or a drain diffusion region of a MOS transistor.

9. A method of manufacturing a semiconductor device according to claim 1; wherein the step of introducing impurities is carried out by implanting impurity ions in the semiconductor substrate using an ion beau and forming an impurity introduction region by means of thermal diffusion.

10. A method of manufacturing a semiconductor device according to claim 1; wherein said semiconductor substrate is of a first conductivity type and said impurities are of a second conductivity type.

11. A method of manufacturing a semiconductor device according to claim 1; wherein the fully opened pattern portion and the partially opened pattern portion of the resist mask pattern extend in a horizontal direction along a surface of the semiconductor substrate on which the silicon oxide film is disposed.

12. A method of manufacturing a MOS semiconductor device, comprising the steps: providing a gate electrode on a semiconductor substrate through a silicon oxide film; disposing a resist mask pattern in contact with a the silicon oxide film, said resist mask pattern having a fully opened region and a partially opened region disposed between the fully opened region and the gate electrode, the partially opened region having alternating masked portions and portions exposing the silicon oxide film which partly block and partly permit, respectively, the introduction of impurities therethrough; and selectively introducing impurities into an impurity introduction region of said semiconductor substrate through the fully opened region and the partially opened region of said resist mask pattern to form areas having high and low impurity densities in said impurity introduction region.

13. A method of manufacturing a semiconductor device according to claim 12; wherein the step of selectively introducing impurities is carried out by implanting impurity ions in said semiconductor substrate using an ion beam and forming said impurity introduction region by means of thermal diffusion.

14. A method of manufacturing a semiconductor device according to claim 12; wherein said semiconductor substrate is of a first conductivity type and said impurities are of a second conductivity type.

15. A method of manufacturing a semiconductor device according to claim 12; wherein said impurity introduction region constitutes a source diffusion layer region and a drain diffusion layer region of a MOS type transistor, and said source diffusion layer region and drain diffusion layer region are comprised of a high-density impurity diffusion layer and a low-density impurity diffusion layer adjacent to each other.

16. A method of manufacturing a semiconductor device according to claim 12; wherein the step of selectively introducing impurities comprises implanting impurity ions in said semiconductor substrate in a single implantation, step and subjecting the implanted impurity ions to thermal diffusion to form both a high-density impurity diffusion layer and a low-density impurity diffusion layer.

17. A method of manufacturing a semiconductor device according to claim 16; wherein the high-density and low-density impurity diffusion layers constitute one of a source diffusion layer region or a drain diffusion layer region of a MOS type transistor.

18. A method of manufacturing a semiconductor device according to claim 12; wherein the fully opened region and the partially opened region of the resist mask pattern extend in a horizontal direction along a surface of the semiconductor substrate on which the silicon oxide film is disposed.

19. A method of manufacturing a MOS semiconductor device, comprising the steps; providing a semiconductor substrate having a silicon oxide film and an impurity introduction region; providing a gate electrode on the semiconductor substrate through the silicon oxide film; disposing a resist mask pattern in contact with the silicon oxide film of the semiconductor substrate so that a first open pattern portion and a second open pattern portion of the resist mask pattern are disposed over the impurity introduction region of the semiconductor substrate, the second open pattern portion being disposed between the first open pattern portion and the gate electrode and having alternating masked portions and portions exposing the silicon oxide film which partly block and partly permit, respectively, the introduction of impurities therethrough; and selectively introducing impurities through the first and second open pattern portions of the resist mask pattern into the impurity introduction region of the semiconductor substrate to form therein an area of higher impurity density beneath the first open pattern portion and an area of lower impurity density beneath the second open pattern portion.

20. A method of manufacturing a semiconductor device according to claim 19; wherein the step of selectively introducing impurities is carried out by implanting impurity ions in the semiconductor substrate using an ion beam and forming the impurity introduction region by means of thermal diffusion.

21. A method of manufacturing a semiconductor device according to claim 19; wherein the semiconductor substrate is of a first conductivity type and the impurities are of a second conductivity type.

22. A method of manufacturing a semiconductor device according to claim 21; wherein the impurity introduction region constitutes a source diffusion layer region and a drain diffusion layer region of a MOS type transistor, and the source diffusion layer region and drain diffusion layer region are comprised of a high-density impurity diffusion layer and a low-density impurity diffusion layer adjacent to each other.

23. A method of manufacturing a semiconductor device according to claim 19; wherein the first and second open pattern portions of the resist mask pattern extend in a horizontal direction along a surface of the semiconductor substrate on which the silicon oxide film is disposed.

* * * * *